US010840865B1

(12) United States Patent
Banerjee et al.

(10) Patent No.: US 10,840,865 B1
(45) Date of Patent: Nov. 17, 2020

(54) DIFFERENTIAL REFERENCE BUFFER FOR ANALOG-TO-DIGITAL CONVERTERS

(71) Applicant: Analog Devices International Unlimited Company, Limerick (IE)

(72) Inventors: Debopam Banerjee, Bangalore (IN); Venkata Aruna Srikanth Nittala, Bengaluru (IN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/513,614

(22) Filed: Jul. 16, 2019

(51) Int. Cl.
*H03F 3/45* (2006.01)
*H03M 1/38* (2006.01)
*H03M 3/00* (2006.01)

(52) U.S. Cl.
CPC ....... *H03F 3/45269* (2013.01); *H03F 3/4517* (2013.01); *H03F 3/45134* (2013.01); *H03F 3/45192* (2013.01); *H03M 1/38* (2013.01); *H03M 3/458* (2013.01); *H03F 2203/45138* (2013.01); *H03F 2203/45616* (2013.01)

(58) Field of Classification Search
CPC ............. H03F 3/45269; H03F 3/45192; H03F 3/4517; H03F 3/45134; H03F 2203/45138; H03F 2203/45616; H03M 3/458; H03M 1/38
USPC .................. 341/143, 155, 172; 330/69, 109, 330/252–253, 260
See application file for complete search history.

(56) References Cited

U.S. PATENT DOCUMENTS

| | | | |
|---|---|---|---|
| 6,359,510 B1 | 3/2002 | Ishii et al. | |
| 6,400,225 B1 | 6/2002 | Kruiskamp | |
| 6,469,576 B2 * | 10/2002 | Hasegawa | H03F 3/45192 330/109 |
| 6,753,801 B2 | 6/2004 | Rossi | |
| 7,126,423 B1 * | 10/2006 | Kruiskamp | H03F 1/34 330/253 |
| 7,265,622 B1 | 9/2007 | Koike | |
| 7,627,303 B2 | 12/2009 | Stoll et al. | |
| 9,294,048 B2 * | 3/2016 | Van Helleputte | H03F 3/68 |

(Continued)

FOREIGN PATENT DOCUMENTS

| | | |
|---|---|---|
| CN | 104270150 B | 9/2017 |
| WO | WO-03049282 A1 | 6/2003 |

OTHER PUBLICATIONS

Alzaher, Hussain, et al., "A CMOS Fully Balanced Differential Difference Amplifier and Its Applications", IEEE Transactions on Circuits and Systems—II: Analog and Digital Signal Processing, 48(6), (Jun. 2001), 7 pgs.

(Continued)

Primary Examiner — Khai M Nguyen
(74) Attorney, Agent, or Firm — Schwegman Lundberg & Woessner, P.A.

(57) ABSTRACT

A reference buffer circuit comprises a dual-difference amplifier circuit including a first differential input, a second differential input, and a differential output that provides a differential reference signal; a first reference voltage coupled to a first input of the first differential input and a second reference voltage coupled to a first input of the second differential input; and wherein outputs of the differential output are connected by a feedback circuit path to second inputs of the first and second differential inputs.

20 Claims, 5 Drawing Sheets

(56) References Cited

U.S. PATENT DOCUMENTS

2019/0158033 A1* 5/2019 Lee ................... H03F 3/4521

OTHER PUBLICATIONS

Arbet, Daniel, et al., "Fully Differential Difference Amplifier for Low-Noise and Low-Distortion Applications", Journal of Circuits, Systems, and Computers, 25(1), World Scientific Publishing Co., (2016), 18 pgs.

Elsobky, Mourad, et al., "Design of a CMOS readout circuit on ultra-thin flexible silicon chip for printed strain gauges", Advances in Radio Science, 15, Copernicus Publications, (2017), 8 pgs.

Khateb, Fabian, et al., "A compact power-efficient 0.5 V fully differential difference amplifier", Intl. Journal of Electronics and Communications 105, Elsevier GmbH, (2019), 7 pgs.

Kulej, Tomasz, et al., ".4-V bulk-driven differential-difference amplifier", Microelectronics Journal 46, Elsevier Ltd., (2015), 8 pgs.

Mahmoud, Soliman A., et al., "The Differential Difference Operational Floating Amplifier: A New Block for Analog Signal Processing in MOS Technology", IEEE Transactions on Circuits and Systems II—Analog and Digital Signal Processing, 45(1), (Jan. 1998), 11 pgs.

Naqvi, Syed Roomi, "Fully Differential Difference Amplifier based Microphone Interface Circuit and an Adaptive Signal to Noise Ratio Analog Front end for Dual Channel Digital Hearing Aids", Doctorate Dissertation at Arizona State University, (Aug. 2011), 97 pgs.

\* cited by examiner

DIFFERENTIAL REFERENCE BUFFER FOR ANALOG-TO-DIGITAL CONVERTERS

FIELD OF THE DISCLOSURE

This document relates to integrated circuits and in particular to low noise reference circuits.

BACKGROUND

Reference circuits are used to provide a voltage or current reference for comparison during an operation performed by an electronic circuit. For example, comparators can be used in successive approximation register (SAR) analog-to-digital converters (ADCs) to resolve the results of bit trials during the conversion process by comparing the results to a voltage reference. However, performance of electronic circuits such as ADCs can be sensitive to circuit noise including circuit noise inherently present in the voltage reference and coupling from other sources onto the voltage reference.

SUMMARY OF THE DISCLOSURE

This document relates generally to buffer circuits and more specifically to a very low noise buffer circuit for a voltage reference. In some aspects, a reference buffer circuit includes a dual-difference amplifier circuit including a first differential input, a second differential input, and a differential output that provides a differential reference signal. The first and second differential inputs are coupled to a first differential input transistor pair of a first transistor type and a second differential input transistor pair of a second transistor type complementary to the first transistor type. A first reference voltage coupled to a first input of the first differential input and a second reference voltage coupled to a first input of the second differential input. The outputs of the differential output are connected by a feedback circuit path to second inputs of the first and second differential inputs.

In some aspects, an electronic system includes an analog-to-digital converter (ADC) circuit, and a reference buffer circuit coupled to the ADC circuit. The reference buffer circuit includes a first differential input transistor pair comprised of n-type field effect transistors (NFETs), a second differential input transistor pair comprised of p-type field effect transistors (PFETs), a folded cascade amplifier stage coupled to the first differential input transistor pair and the second differential input transistor pair, and a differential output stage coupled to the folded cascade amplifier stage and including a differential output that provides a differential reference signal.

In some aspects, an electronic system includes an analog-to-digital converter (ADC) circuit, and a reference buffer circuit coupled to the ADC circuit. The reference buffer circuit includes a first differential input transistor pair comprised of n-type field effect transistors (NFETs), a second differential input transistor pair comprised of p-type field effect transistors (PFETs); wherein a drain region of a first transistor of the first differential input transistor pair is coupled to a drain region of a first transistor of the second differential input transistor pair; and a drain region of a second transistor of the first differential input transistor pair is coupled to a drain region of a second transistor of the second differential input transistor pair; and a differential output stage coupled to the first differential input transistor pair and the second differential input transistor pair, the output stage configured to provide a differential output that provides a differential reference signal.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A voltage reference can be used by an ADC circuit to resolve the results of bit trials during the conversion process. The voltage reference circuit may couple noise from a noise source into an analog-to-digital (A/D) conversion that can be significant for high accuracy ADC circuits.

Figure 1:
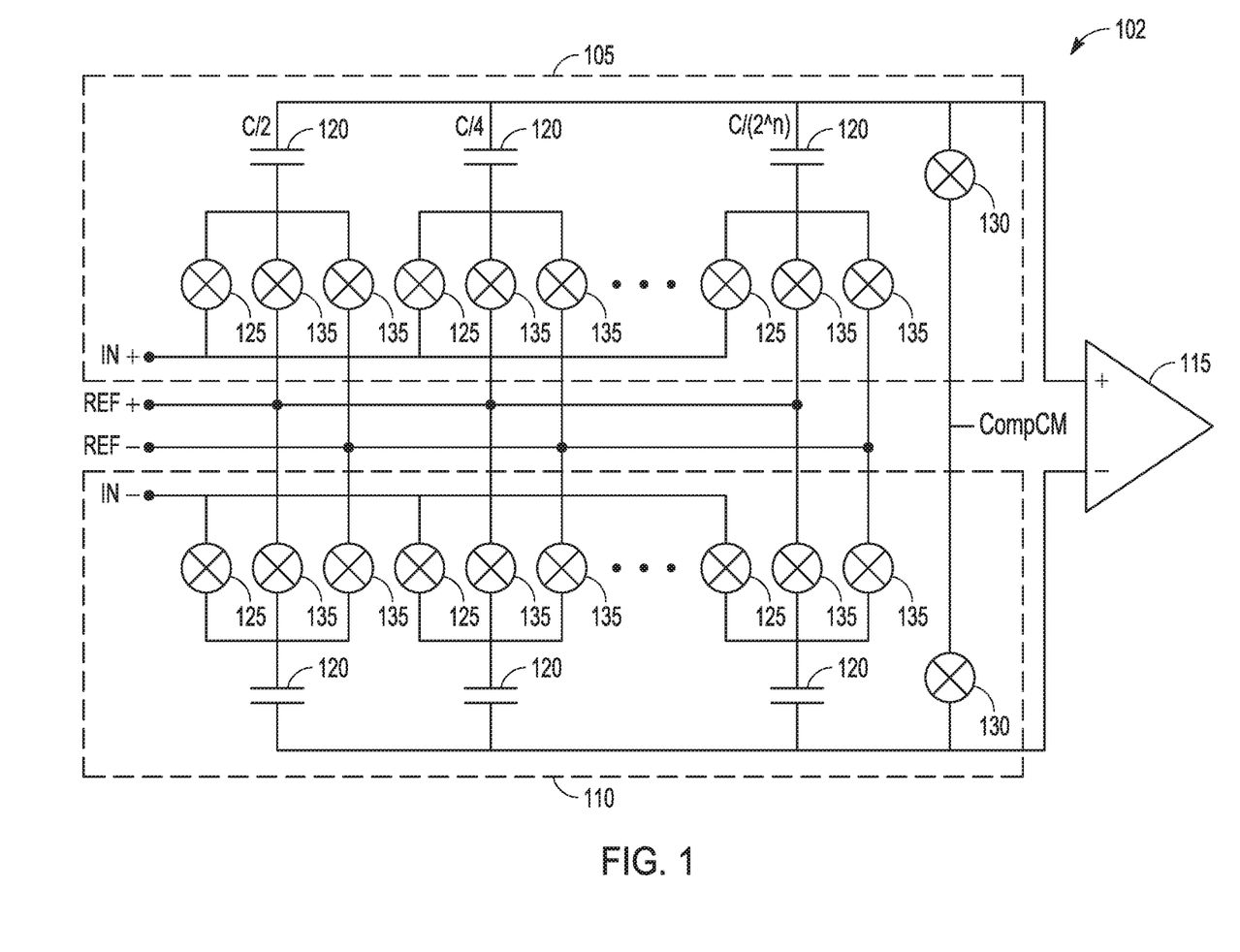
FIG. 1 is a functional block diagram of an example of a differential SAR ADC circuit.

FIG. 1 is a functional block diagram of an example of a differential SAR ADC circuit. The SAR ADC circuit 102 includes a positive digital-to-analog converter (DAC) 105, a negative DAC 110, and a comparator circuit 115. Each DAC includes weighted bit capacitors 120. In the example, the capacitors are weighted as C/2, C/4 ... C/($2^N$), where N is the number of bits (e.g., N=5) in the DACs and C is the total capacitance of the bit capacitors added together. A differential analog input voltage (IN+, IN−) is sampled onto the bit capacitors with respect to the common mode of the comparator (CompCM) by closing switches 125 and 130. The input voltage is held on the capacitors by opening switches 130, then opening switches 125. The top plates of the capacitors are at the CompCM voltage.

The positive DAC 105 and the negative DAC 110 can be connected to a differential reference voltage (REF+, REF−). As part of the successive approximation routine, bit trials for each of the bit capacitors are performed iteratively. In a bit trial, the output of the positive DAC 105 and the output of the negative DAC 110 are applied to the inputs of the comparator circuit 115. Based on the output of the comparator circuit, a bit capacitor is connected to either REF+ or REF− using switches 135. If the bit capacitor is connected to REF+ the bit of the digital value corresponding to the bit capacitors is assigned a logic value '1', and if the bit capacitor is connected to REF+ the bit of the digital value corresponding to the bit capacitors is assigned a logic value '0'. Conversion then proceeds to the next bit capacitor until all bits of the digital value $D_{out}$ are determined.

The reference circuit that provides the reference voltage $V_{ref}$ can be a source of circuit noise. A precision ADC may require two accurate and low-noise analog inputs to determine the digital equivalent output word $D_{out}=V_{in}/V_{ref}$ from the analog inputs. There are some critical events in an ADC circuit's operation that can impact the accuracy of the A/D conversion. The events include the instance in time when the sampling of the analog input ends, the end of the residue amplification phase (e.g., performed as part of a pipelined ADC) where a clean (i.e., noise-free) reference is connected to the bit trial capacitors, and the last few bit trials (i.e., least significant bits) of an SAR-ADC. Noise interference during these critical events can result in erroneous results.

The conventional approach to produce an accurate A/D conversion is to avoid interference from noise during these critical events by ensuring very low noise or "a quiet time" during the critical events when digital activity is minimal to none, and limiting the bandwidth of the residue amplification or the bit trial operation along with minimizing activity on the I/O ring caused by read-outs or write-ins.

However, circuit noise can be coupled from the noise source to the reference voltage circuit (e.g., a bandgap reference circuit). One noise source is the asynchronous operation of other ADC circuits on the same integrated circuit. This noise can be coupled through circuit ground or the substrate of the integrated circuits. Data read-back is another source of noise coupling. If the ADC circuit is driven using an external accurate source from a board, then during a read/write operation, the input/output (I/O) ring of the integrated circuit may see massive current surges that may result in large noise jumps coupling to the sensitive nodes of the ADC circuit.

Digital activity of circuits on the integrated circuit can also cause noise interference; especially in harsh silicon-on-chip (SOC) environments where the analog circuitry may be co-located with one or more processors and other digital peripheral circuits. Some conventional buffer circuits for the voltage reference attempt to filter noise by using an off-chip capacitor referenced to a ground at the output of the buffer circuit. This approach can cause noise issues if there is a lot of digital activity and the digital activity somehow couples onto the bottom-plates of the capacitors of the DAC right before a bit decision is performed. The same problem can occur via substrate coupling if the capacitor referenced to ground is a distributed on-chip capacitor.

An approach to implementing a reference buffer circuit that is low noise is to have the reference buffer circuit measure the difference between the reference voltages (e.g., VREF+, VREF−) received at the input to the reference buffer circuit, and through a difference sensing loop enforce the same difference at a differential output of the reference buffer circuit. This would prevent noise from coupling differently to the REF+ and REF− nodes of the ADC circuit from a noise source such as an I/O ring or substrate. A circuit using a dual-difference amplifier (DDA) can provide this functionality.

Figure 2:
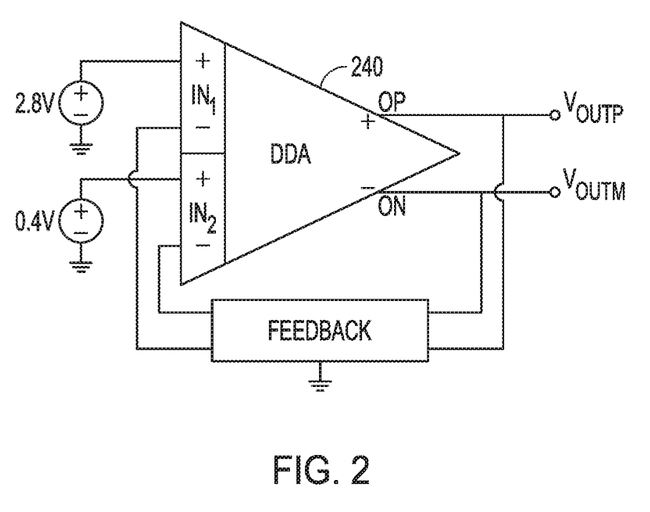
FIG. 2 is a circuit diagram of an example of a dual-difference amplifier circuit placed in a feedback loop.

FIG. 2 is a diagram of a DDA circuit placed in a feedback loop. The DDA circuit 240 includes two differential inputs ($IN_1$ and $IN_2$) and one differential output. One input (e.g., the more positive input) of each differential input is coupled to a reference circuit to establish a differential reference input to the DDA. In the example of FIG. 2, the first input of $IN_1$ is coupled a 2.8 volt (2.8V) bandgap reference and the first input of $IN_2$ is coupled to a 0.4V bandgap reference. The other inputs of $IN_1$ and $IN_2$ are coupled to the feedback network (e.g., a feedback loop), and ground noise to the amplifier output acts as common-mode noise for the references coupled to the inputs $IN_1+$ and $IN_2+$. If the DDA has the appropriate gain, the feedback loop will force the differential output to be the same as the difference in voltage at $IN_1+$ and $IN_2+$, thereby rejecting noise coupled into the ADC circuits.

Figure 3:
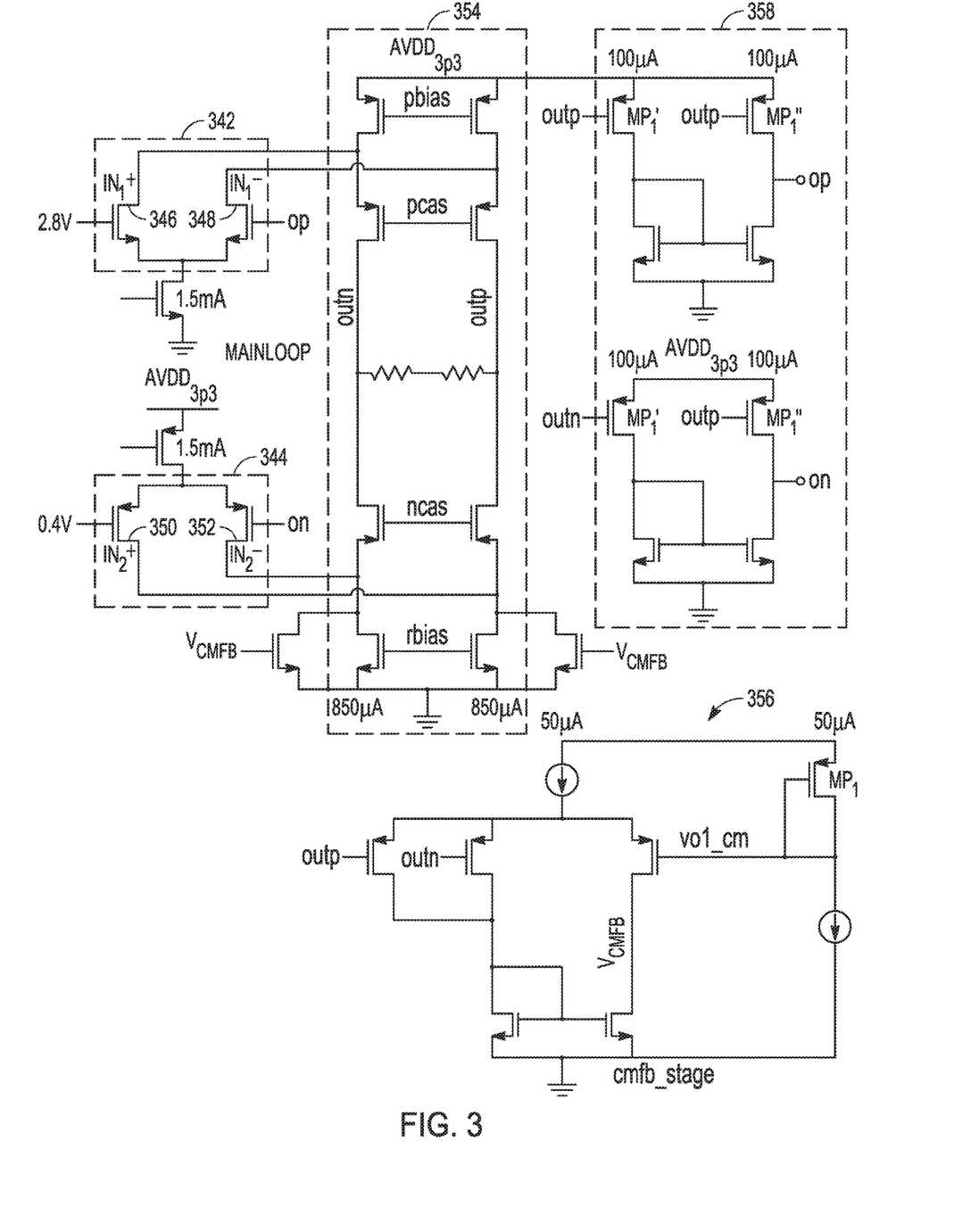
FIG. 3 is a circuit diagram of an example of a dual-difference amplifier circuit.

FIG. 3 is a circuit diagram of an example of a DDA circuit 340 that can be used in the reference buffer circuit of FIG. 2. The DDA circuit 340 includes a first differential input ($IN_1+$, $IN_1−$), a second differential input ($IN_2+$, $IN_2−$), and a differential output (op, on). A first reference voltage (e.g., 2.8V) is coupled to the first input ($IN_1+$) of the first differential input and a second reference voltage (e.g., 0.4V) is coupled to the first input ($IN_2+$) of the second differential input, and a differential voltage of 2.4V is generated at the differential output (op, on) of the DDA circuit 340. The outputs of the differential output are connected by a feedback circuit path to the second inputs ($IN_1−$ and $IN_2−$) of the differential inputs.

The DDA circuit 340 includes two differential input transistor pairs 342, 344. The transistors of one differential input transistor pair are of a complementary type of the transistors of the other transistor pair. In the example of FIG. 3, the transistors 346, 348 of input transistor pair 342 are n-type field effect transistors (NFETs) and the transistors 350, 352 of input transistor pair 344 are p-type field effect transistors (PFETs). In variations, the transistors 346, 348 of input transistor pair 342 are n-type metal oxide semiconductor (NMOS) transistors and the transistors 350, 352 of input transistor pair 344 are p-type metal oxide semiconductor (PMOS) transistors.

This complimentary input feature is advantageous if the reference buffer circuit receives reference inputs that are static and wide apart in terms of dynamic range. This form of implementation gives all the benefits of differential operation, such as isolation of substrate noise, common mode rejection ratio (CMRR) to noise jumps coupling from the I/O ring, etc. In further variations, the transistors may be NPN and PNP bipolar transistors, or n-channel junction FETs (NJFETs) and PJFETs.

The reference voltages are coupled to different input transistors pairs of the DDA circuit 340. In the example of FIG. 3, the 2.8V reference (REF+) is coupled to transistor 346 of input transistor pair 342, and the 0.4V reference (REF−) is coupled to transistor 350 of input transistor pair 344. The outputs of the DDA circuit 340 are fed back to different input transistors pairs of the DDA circuit 340. The positive output (op) of the DDA circuit 340 is fed back to transistor 348, and the negative output (on) of the DDA circuit 340 is fed back to transistor 352.

The DDA circuit 340 includes a folded cascode amplifier stage 354 coupled to the first and second differential input transistor pairs. The DDA circuit 340 includes a common mode feedback stage 356 coupled to the folded cascode amplifier stage 354 to bias the common mode of the first stage of the DDA circuit 340. The differential input transistor pairs 342, 344 each generate a small signal current, and the small signal currents are summed and amplified at the nodes of the folded cascode amplifier stage 354 labeled OUTP and OUTN and the summed currents are provided to the output stage or second stage of the DDA circuit 340.

The output stage 358 may include two class AB amplifier circuits. Class AB amplifiers combine Class A and Class B amplifier operation to achieve an amplifier with more efficiency than a Class A amplifier but with lower distortion than class B. This is achieved by biasing both transistors (MP' and MP") so they conduct when the signal is close to zero (the point where class B amplifiers introduce non-linearities). The transistors transition to class B operation for large excursions. For small signals both transistors are active, and a class AB amplifier acts like a class A amplifier. For large signal excursions, only one transistor is active for each half of the waveform, and a class AB amplifier acts like a class B amplifier. In certain variations the output stage may include two class A amplifiers.

Figure 4:
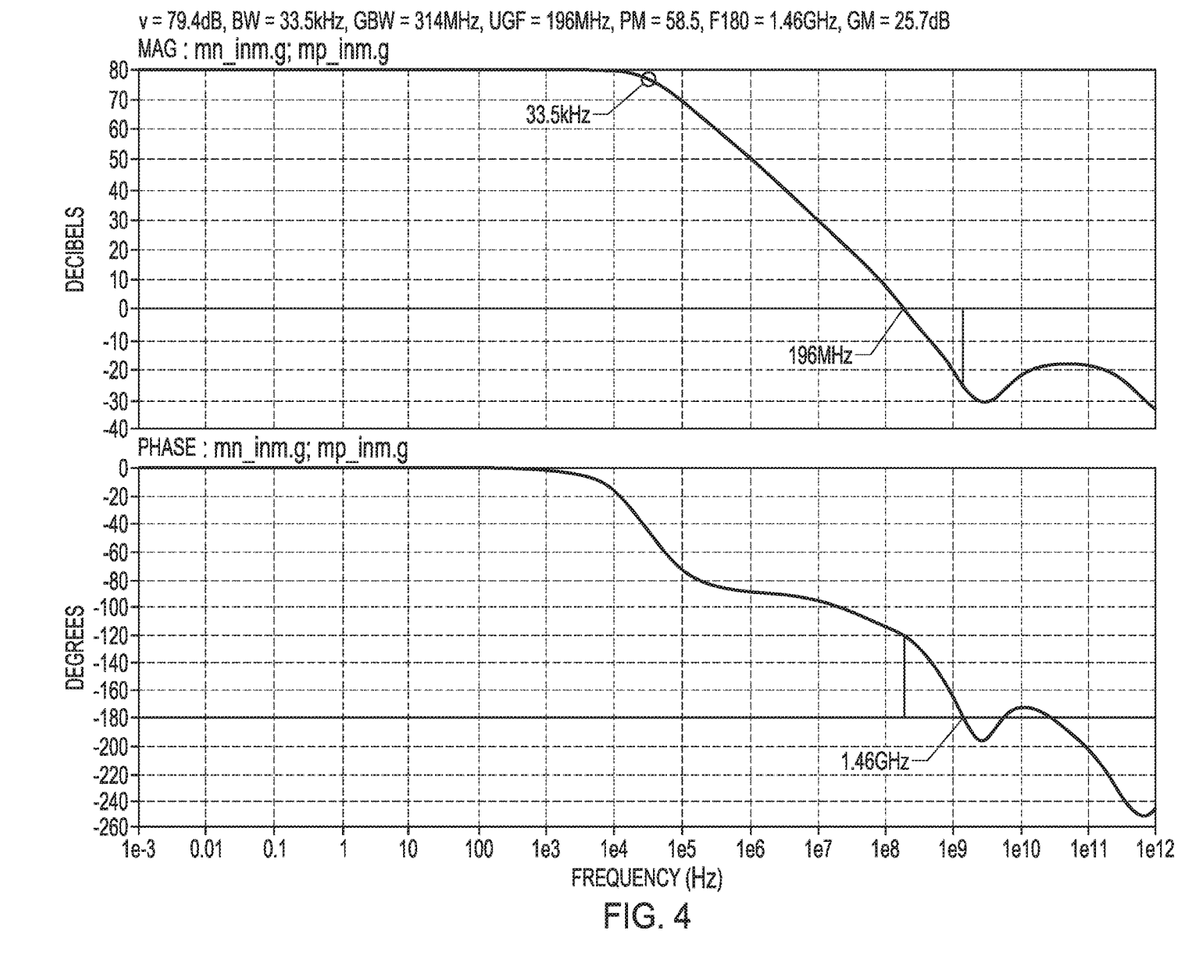
FIG. 4 is an illustration of simulation of the dual-difference amplifier circuit of FIG. 3

FIG. 4 is an illustration of simulation graphs of the gain and phase of the DDA circuit 340 of FIG. 3.

Figure 5:
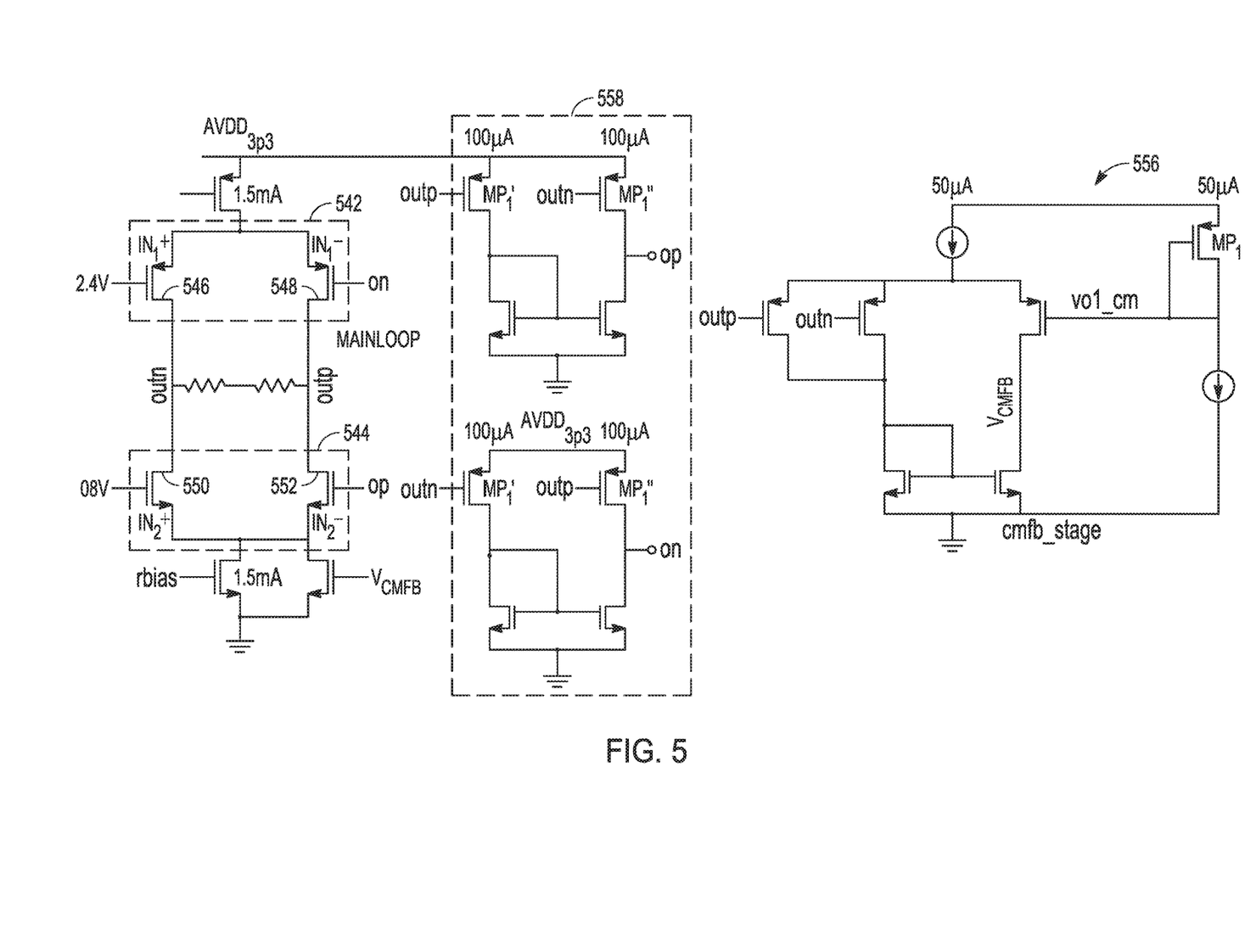
FIG. 5 is a circuit diagram of another example of a dual-difference amplifier circuit.

FIG. 5 is a circuit diagram of another example of a DDA circuit 540 that can be used in the reference buffer circuit of FIG. 2. As in the example of FIG. 3, the differential inputs ((IN$_1$+, IN$_1$−, and IN$_2$+, IN$_2$−), of the DDA circuit 540 are coupled to input transistor pairs 542, 544, and the transistors of the input transistor pairs are complementary. In the example of FIG. 5, the transistors 546, 548 of input transistor pair 542 are p-type field effect transistors (PFETs) and the transistors 550, 552 of input transistor pair 544 are n-type field effect transistors (NFETs).

Instead of the input transistor pairs being connected to a folded cascode amplifier stage as in the example of FIG. 3, the input transistor pairs 542, 544 are connected to each other back-to-back. The drain region of transistor 546 of input transistor pair 542 is coupled to the drain region of transistor 550 of input transistor pair 544, and the drain region of transistor 548 of input transistor pair 542 is coupled to the drain region of transistor 552 of input transistor pair 544.

A 2.4V reference circuit (e.g., a bandgap reference circuit) is coupled to the gate region of transistor 546 of input transistor pair 542 (IN$_1$+), and a 0.8V reference circuit is coupled to the gate region of transistor 550 of input transistor pair 544 (IN$_2$+), and a differential voltage of 1.6V is generated at the differential output. The outputs of the DDA circuit 540 are fed back to different input transistors pairs. The positive output (OP) of the DDA circuit 540 is coupled to transistor 552 of the second input transistor pair 544, and the negative output (ON) of the DDA circuit 540 is coupled to transistor 548 of input transistor pair 542.

The differential input transistor pairs 542, 544 each generate a small signal current, and the small signal currents are summed and amplified at the nodes labeled OUTP and OUTN in the first stage. The summed currents are provided to the output stage 558 that includes two class AB amplifier circuits. The DDA circuit 540 includes a common mode feedback stage 556 coupled to the input transistor pairs to bias the common mode of the first stage of the DDA circuit 540. Because the DDA circuit 540 does not include the cascode amplifier stage the DDA circuit 540 of FIG. 5 any circuit noise from the cascode amplifier is not present in the DDA circuit 540 of FIG. 5. Also, the differential input may reduce power over other differential input arrangements because both differential pairs use the same current from supply to ground.

Returning to FIG. 2, for either. DDA circuit example the feedback circuit path may be scaled to something other than unity to provide a differential reference signal at the output that is scaled from the difference between the input reference voltages.

The devices, systems and methods described herein provide reference buffer circuits that makes optimum use of current and area while achieving better noise and speed specifications than conventional approaches without a decrease in performance. The reference buffer circuits can generate a fully differential reference voltage at the differential output that can be provided to a SAR ADC, Delta-Sigma ADC, a Pipelined ADC or other hybrid ADC, with maximum isolation from noisy grounds and substrates.

Additional Description and Aspects

Aspect 1 can include subject matter (such as a reference buffer circuit) comprising a dual-difference amplifier circuit, a first reference voltage, and a second first reference voltage. The dual-difference amplifier circuit includes a first differential input, a second differential input, and a differential output that provides a differential reference signal. The first and second differential inputs are coupled to a first differential input transistor pair of a first transistor type and a second differential input transistor pair of a second transistor type complementary to the first transistor type. The first reference voltage is coupled to a first input of the first differential input and the second reference voltage is coupled to a first input of the second differential input. The outputs of the differential output are connected by a feedback circuit path to second inputs of the first and second differential inputs.

In Aspect 2, the subject matter of Aspect 1 optionally includes a first differential input transistor pair comprised of one of n-type field effect transistors (NFETs) or p-type field effect transistors (PFETs), and the second differential input transistor pair comprised of the other of NFETs or PFETs from the first differential input transistor pair.

In Aspect 3, the subject matter of one or both of Aspects 1 and 2 optionally includes a dual-difference amplifier circuit including a folded cascode amplifier stage coupled to the first differential input transistor pair and the second differential input transistor pair.

In Aspect 4, the subject matter of one or any combination of Aspects 1-3 optionally includes a first transistor of the first differential input transistor pair is coupled to the first reference voltage, a second transistor of the first differential input transistor pair is coupled to a first output of the differential output of the dual-difference amplifier circuit, a first transistor of the second differential input transistor pair is coupled to the second reference voltage, and a second transistor of the second differential input transistor pair is coupled to a second output of the differential output of the dual-difference amplifier circuit.

In Aspect 5, the subject matter of one or any combination of Aspects 1-4 optionally includes the first and second differential inputs receiving a differential input voltage greater than two volts.

In Aspect 6, the subject matter of one or both of Aspects 1 and 2 optionally includes a drain region of a first transistor of the first differential input transistor pair is coupled to a drain region of a first transistor of the second differential input transistor pair, and a drain region of a second transistor of the first differential input transistor pair is coupled to a drain region of a second transistor of the second differential input transistor pair.

In Aspect 7, the subject matter of Aspect 6 optionally includes a first transistor of the first differential input transistor pair is coupled to the first reference voltage, a first transistor of the second differential input transistor pair is coupled to the second reference voltage, a second transistor of the second differential input transistor is coupled to a first output of the differential output of the dual-difference amplifier circuit, and a second transistor of the first differential input transistor is coupled to a second output of the differential output of the dual-difference amplifier circuit.

In Aspect 8, the subject matter of one or both of Aspects 6 and 7 optionally includes the first and second differential inputs receiving a differential input voltage is less than two volts.

In Aspect 9, the subject matter of one or any combination of Aspects 1-8 optionally includes a dual-difference amplifier circuit including an output stage, and the first and second differential input transistor pairs each generate a small signal current, and the small signal currents are summed and amplified before being provided to the output stage.

In Aspect 10, the subject matter of Aspect 9 optionally includes an output stage including a first class-AB output driver circuit and a second class-AB output driver circuit.

In Aspect 11, the subject matter of one or any combination of Aspects 1-10 optionally includes a common mode bias circuit configured to set a common mode voltage of the dual-difference amplifier circuit.

In Aspect 12, the subject matter of one or any combination of Aspects 1-11 optionally includes a feedback circuit path configured to scale a difference between the first reference voltage and the second reference voltage to provide the differential reference signal.

Aspect 13 includes subject matter (such as an electronic system) or can optionally be combined with one or any combination of Aspects 1-12 to include such subject matter, comprising an analog-to-digital converter (ADC) circuit, and a reference buffer circuit coupled to the ADC circuit. The reference buffer circuit including a first differential input transistor pair comprised of n-type field effect transistors (NFETs), a second differential input transistor pair comprised of p-type field effect transistors (PFETs), a folded cascode amplifier stage coupled to the first differential input transistor pair and the second differential input transistor pair, and a differential output stage coupled to the folded cascode amplifier stage and including a differential output that provides a differential reference signal.

In Aspect 14, the subject matter of Aspect 13 optionally includes a first reference voltage source coupled to a first transistor of the first differential input transistor pair of the reference buffer circuit, a second reference voltage source coupled to a first transistor of the second differential input transistor pair of the reference buffer circuit, and the reference buffer circuit including a feedback circuit path including a second transistor of the first differential input transistor pair coupled to a first output of the differential output stage; and a second transistor of the second differential input transistor pair coupled to a second output of the differential output.

In Aspect 15, the subject matter of one or both of Aspects 13 and 14 optionally includes an ADC circuit that is a successive approximation register (SAR) ADC circuit.

In Aspect 16, the subject matter of one or both of Aspects 13 and 14 optionally includes an ADC circuit that is a Delta-Sigma ADC circuit.

Aspect 17 includes subject matter (such as an electronic system) or can optionally be combined with one or any combination of Aspects 1-15 to include such subject matter, comprising an analog-to-digital converter (ADC) circuit, and a reference buffer circuit coupled to the ADC circuit. The reference buffer circuit including a first differential input transistor pair comprised of n-type field effect transistors (NFETs), and a second differential input transistor pair comprised of p-type field effect transistors (PFETs). The drain region of a second transistor of the first differential input transistor pair is coupled to a drain region of a second transistor of the second differential input transistor pair. The reference buffer circuit includes a differential output stage coupled to the first differential input transistor pair and the second differential input transistor pair, the output stage configured to provide a differential output that provides a differential reference signal.

In Aspect 18, the subject matter of Aspect 17 optionally includes a first reference voltage source coupled to a first transistor of the first differential input transistor pair, and a second reference voltage source coupled to a first transistor of the second differential input transistor pair. The reference buffer circuit includes a feedback circuit path including a second transistor of the second differential input transistor pair coupled to a first output of the differential output stage; and a second transistor of the first differential input transistor pair coupled to a first output of the differential output stage.

In Aspect 19, the subject matter of one or both of Aspects 17 and 18 optionally includes an ADC circuit that is a successive approximation register (SAIL.) ADC circuit.

In Aspect 20, the subject matter of one or both of Aspects 17 and 18 optionally includes an ADC circuit that is a Delta-Sigma ADC circuit.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A reference buffer circuit comprising:
a dual-difference amplifier circuit including a first differential input, a second differential input, and a differential output that provides a differential reference signal, wherein the first and second differential inputs are coupled to a first differential input transistor pair of a first transistor type and a second differential input transistor pair of a second transistor type complementary to the first transistor type;
a first reference voltage coupled to a first input of the first differential input and a second reference voltage coupled to a first input of the second differential input; and
wherein outputs of the differential output are connected by a feedback circuit path to second inputs of the first and second differential inputs.

2. The reference buffer circuit of claim 1, wherein the first differential input transistor pair comprises one of n-type field effect transistors (NFETs) or p-type field effect transistors (PFETs), and the second differential input transistor pair comprises the other of NFETs or PFETs from the first differential input transistor pair.

3. The reference buffer circuit of claim 1, wherein the first differential input transistor pair comprises one of NPN-type bipolar junction transistors (NPN BJTs) or PNP-type bipolar junction transistors (PNP-BJTs) and the and the second differential input transistor pair comprised of the other of NPN BJTs or PNP BJTs from the first differential input transistor pair.

4. The reference buffer circuit of claim 1, wherein the dual-difference amplifier circuit includes a folded cascode amplifier stage coupled to the first differential input transistor pair and the second differential input transistor pair.

5. The reference buffer circuit of claim 4, wherein
a first transistor of the first differential input transistor pair is coupled to the first reference voltage;
a second transistor of the first differential input transistor pair is coupled to a first output of the differential output of the dual-difference amplifier circuit;
a first transistor of the second differential input transistor pair is coupled to the second reference voltage; and
a second transistor of the second differential input transistor pair is coupled to a second output of the differential output of the dual-difference amplifier circuit.

6. The reference buffer circuit of claim 5, wherein
a first transistor of the first differential input transistor pair is coupled to the first reference voltage;
a first transistor of the second differential input transistor pair is coupled to the second reference voltage;
a second transistor of the second differential input transistor pair is coupled to a first output of the differential output of the dual-difference amplifier circuit; and
a second transistor of the first differential input transistor is coupled to a second output of the differential output of the dual-difference amplifier circuit.

7. The reference buffer circuit of claim 1, wherein
a drain region of a first transistor of the first differential input transistor pair is coupled to a drain region of a first transistor of the second differential input transistor pair; and
a drain region of a second transistor of the first differential input transistor pair is coupled to a drain region of a second transistor of the second differential input transistor pair.

8. The reference buffer circuit of claim 1,
wherein the dual-difference amplifier circuit includes an output stage; and
wherein the first and second differential input transistor pairs each generate a small signal current, and the small signal currents are summed and amplified before being provided to the output stage.

9. The reference buffer circuit of claim 8, wherein the output stage comprises a first class-AB output driver circuit and a second class-AB output driver circuit.

10. The reference buffer circuit of claim 8, wherein the output stage comprises a first class-A output driver circuit and a second class-A output driver circuit.

11. The reference buffer circuit of claim 1, including a common mode bias circuit configured to set a common mode voltage of the dual-difference amplifier circuit.

12. The reference buffer circuit of claim 1, wherein the feedback circuit path is configured to scale a difference between the first reference voltage and the second reference voltage to provide the differential reference signal.

13. An electronic system comprising:
an analog-to-digital converter (ADC) circuit; and
a reference buffer circuit coupled to the ADC circuit, including:
a first differential input transistor pair of a first transistor type;
a second differential input transistor pair comprised of a second transistor type complementary to the first transistor type;
an amplifier stage coupled to the first differential input transistor pair and the second differential input transistor pair; and
a differential output stage coupled to the amplifier stage and including a differential output that provides a differential reference signal.

14. The electronic system of claim 13, including:
a first reference voltage source coupled to a first transistor of the first differential input transistor pair of the reference buffer circuit;
a second reference voltage source coupled to a first transistor of the second differential input transistor pair of the reference buffer circuit; and
wherein the reference buffer circuit includes a feedback circuit path including a second transistor of the first differential input transistor pair coupled to a first output of the differential output stage; and a second transistor of the second differential input transistor pair coupled to a second output of the differential output; and
wherein the amplifier stage includes a folded cascode amplifier circuit coupled to the first differential input transistor pair and the second differential input transistor pair.

15. The electronic system of claim 13, wherein the ADC circuit is a successive approximation register (SAR) ADC circuit.

16. The electronic system of claim 13, wherein the ADC circuit is a Delta-Sigma ADC circuit.

17. An electronic system comprising:
an analog-to-digital converter (ADC) circuit; and
a reference buffer circuit coupled to the ADC circuit, including:
a first differential input transistor pair comprised of n-type field effect transistors (NFETs);
a second differential input transistor pair comprised of p-type field effect transistors (PFETs); wherein a drain region of a first transistor of the first differential input transistor pair is coupled to a drain region of a first transistor of the second differential input transistor pair;

and a drain region of a second transistor of the first differential input transistor pair is coupled to a drain region of a second transistor of the second differential input transistor pair; and a differential output stage coupled to the first differential input transistor pair and the second differential input transistor pair, the output stage configured to provide a differential output that provides a differential reference signal.

18. The electronic system of claim 17, including:

a first reference voltage source coupled to a first transistor of the first differential input transistor pair;

a second reference voltage source coupled to a first transistor of the second differential input transistor pair; and wherein the reference buffer circuit includes a feedback circuit path including a second transistor of the second differential input transistor coupled to a first output of the differential output stage; and a second transistor of the first differential input transistor coupled to a second output of the differential output stage.

19. The electronic system of claim 17, wherein the ADC circuit is a successive approximation register (SAR) ADC circuit.

20. The electronic system of claim 17, wherein the ADC circuit is a Delta-Sigma ADC circuit.

* * * * *

UNITED STATES PATENT AND TRADEMARK OFFICE
CERTIFICATE OF CORRECTION

PATENT NO. : 10,840,865 B1
APPLICATION NO. : 16/513614
DATED : November 17, 2020
INVENTOR(S) : Banerjee et al.

Page 1 of 1

It is certified that error appears in the above-identified patent and that said Letters Patent is hereby corrected as shown below:

In the Claims

In Column 10, Line 48, in Claim 14, delete "cascade" and insert --cascode-- therefor Signed and Sealed this
Sixteenth Day of February, 2021

Drew Hirshfeld
*Performing the Functions and Duties of the
Under Secretary of Commerce for Intellectual Property and
Director of the United States Patent and Trademark Office*